United States Patent [19]

Westbrook

[11] Patent Number: 5,026,662
[45] Date of Patent: Jun. 25, 1991

[54] METHOD FOR FABRICATING A SEMICONDUCTOR STRIPE LASER

[75] Inventor: Leslie D. Westbrook, Ipswich, England

[73] Assignee: British Telecommunications public limited company, London, England

[21] Appl. No.: 527,692

[22] Filed: May 24, 1990

Related U.S. Application Data

[63] Continuation of Ser. No. 174,995, filed as PCT GB87/00537 on Jul. 28, 1987, published as WO88/01100 on Feb. 11, 1988, abandoned,

[30] Foreign Application Priority Data

Jul. 28, 1986 [GB] United Kingdom ............... 8618373

[51] Int. Cl.$^5$ ..................... H01L 21/00; H01L 21/76
[52] U.S. Cl. .................... 437/129; 437/89; 437/130; 437/133; 437/7; 437/227; 148/DIG. 95; 156/648; 156/649
[58] Field of Search .............. 437/225, 130, 133, 904, 437/905, 906, 89, 129, 7; 148/DIG. 5; 156/648, 649; 357/17, 56

[56] References Cited

U.S. PATENT DOCUMENTS

| | | | |
|---|---|---|---|
| 3,943,622 | 3/1976 | Kim | 437/89 |
| 4,033,796 | 7/1977 | Burnham | 437/130 |
| 4,111,725 | 9/1978 | Cho | 437/107 |
| 4,468,850 | 9/1984 | Liau et al. | 156/649 |
| 4,575,919 | 3/1986 | Logan | 372/43 |
| 4,619,933 | 10/1986 | Jastrzebski | 437/89 |
| 4,661,175 | 4/1987 | Kuphal | 437/119 |
| 4,662,988 | 5/1987 | Renner | 357/17 |
| 4,727,047 | 2/1988 | Bazler et al. | 437/249 |
| 4,777,148 | 10/1988 | Lian | 437/130 |
| 4,784,722 | 11/1988 | Liau | 437/129 |

OTHER PUBLICATIONS

Lee et al., "Low Threshold Room-Temperature Embedded Heterostructure Lasers", Appl. Phys. Lett., vol. 29, No. 6, 9/76, pp. 365-367.

Electronics Letters, vol. 21, No. 9, 25 Apr. 1985 (Stevenage, Herts. GB) J. E. Bowers et al.: "High-Frequency Modulation of 1.52um Vapour-Phase-Transported InGaAsP Lasers", pp. 392-393.

Applied Physics Letters, vol. 47, No. 2, 15 Jul. 1985, American Institute of Physics, (New York, U.S.), J/E, Bowers et al.: "High-Frequency Constructed Mesa Lasers", pp. 78-80.

IEEE Transactions on Electron Devices, vol. ED-30, No. 3, Mar. 1983, IEEE, (New York, U.S.), R. M. Levin et al.: "The Fabrication of Very Narrow Self-Aligned Guard Rings Around Schottky-Barrier Diodes", pp. 247-249.

IBM Technical Disclosure Bulletin, vol. 24, No. 9, Feb. 1982, (New York, U.S.), C. G. Jambotkar: "Method for Forming Recessed Oxide Isolation Islands", pp. 4744-4745.

Applied Physics Letters, vol. 40, No. 7, 1 Apr. 1982, American Institute of Physics, (New York, U.S.), Z. L. Liau et al.: "A Novel Technique for GaInAsP/InP Buried Heterostructure Laser Fabrication" pp. 568-570.

Electronic Letters, vol. 20, No. 21, 11 Oct. 1984, (Staines, Middlesex GB), T. L. Koch et al.: "Low-Threshold High-Speed 1.55um Vapour Phase Transported Buried Heterostructure Lasers (VPTBH)" pp. 356-857.

(List continued on next page.)

Primary Examiner—Brian E. Hearn
Assistant Examiner—Tuan Nguyen
Attorney, Agent, or Firm—Nixon & Vanderhye

[57] ABSTRACT

A method of undercutting mesa structures in which the lateral extent of the undercut is determined by a prior fabrication stage in which channels (5, 6) are etched and then infilled with a different material. The mesa is formed over the channels (5,6) and a selective etch is used to undercut the mesa, the extent of the undercut (11) being limited by the location of the infilled channels (5, 6). For mechanical stability and insulation the undercuts (11) are filled or partly filled with dielectric (10).

16 Claims, 1 Drawing Sheet

OTHER PUBLICATIONS

IBM Technical Disclosure Bulletin, vol. 24, No. 7N, Dec. 1981, (New York, U.S.) V. J. Silvestri: "Silicon–Silicon Dioxde–Silicon Structures", pp. 3689–3690.

IEEE Journal of Quantum Electronics, vol. QE-21, No. 6, Jun. 1985 "Three and Four Layer LPE InGasAS(P) Mushroom Stripe Lasers for λ=1.30, 1.54 and 1.66um" by Herbert Burkhard and Eckard Kuphal–pp. 650–657.

Electronic Letters 7th Nov. 1985, vol. 21, No. 23–"26-5GHz Bandwidth InGaASP Lasers with Tight Optical Confinement" pp. 1091–1092.

Electronics Letters 20th Jun. 1985 vol. 21, No. 13–"15GHz Direct Modulation Bandwidth of Vapour–-Phase Regrown 1.3um InGaAsP Buried-Heterostructure Lasers under CW Operations at Room Temperature,"–pp. 577–579.

METHOD FOR FABRICATING A SEMICONDUCTOR STRIPE LASER

This is a continuation of application Ser. No. 07/174,995, filed as PCT GB87/00537 on Jul. 28, 1987, published as WO88/01100 on Feb. 11, 1988, now abandoned.

This invention relates to semiconductor device fabrication and in particular to undercutting etching techniques.

In some Structures, for example some types of semiconductor lasers an active region lies between a substrate and a cap layer. In a single mode, buried heterostructure (BH) laser known for use in optical communications, the active region is provided by a stripe of active material often no more than 5 microns wide and typically of the order of 1 to 2 microns wide. (Additional layers may be included such as a buffer layer on top of the stripe. The layers for such structures are grown in sequence on a slice and the slice is subjected to additional fabrication procedures in order to define the lateral structure of the active region.

Different fabrication methods are known for achieving a device having a structure of the BH laser type and depending on the method used, and final structure details, the devices will generally have particular characteristics. Some of these methods entail a blind etching step in which material of one layer must be partially removed from beneath another layer, leaving a boundary of material which is overhung. This arises for instance in a constricted mesa laser structure, having an active region which lies under a significantly wider portion of cap layer.

It is beneficial that there should be a little semiconductor material to either side of the active region but that the lateral extent of the cap layer is still significantly greater. The narrow waist at the active region tends to give a laser having relatively low threshold current and high speed response. The semiconductor material at the sides of the active region gives a low degree of carrier recombination at those sides and low shunt currents, and the wider portion of cap layer has been found to give good reliability.

Such a structure can be made from a wafer including substrate, active layer and cap layer by masking part of the cap layer surface, etching away both cap layer and active layer from the unmasked areas then blind etching the remaining active layer below the cap layer from its exposed sides until only a much narrower active region remains, overhung on both sides by the remaining cap layer. This is achieved by using an etchant that is selective to the material of the active layer. The length of time in the selective etchant determines the width of the defined active region. After the stripe of active material has been defined its exposed sides are covered in semiconductor material.

One of the techniques used for covering the exposed sides of the active region is described by Z L Liau and J N Walpole in Applied Physics Letters Volume 40, No 7, 1 Apr. 1982. In this paper the undercut is formed by blind etching as described above and then the structure is heated in the presence of phosphine so that the sides of the undercut are filled in by mass transport of the material of the cap layer There are problems associated with controlling the heating stage to ensure the correct flow during mass transport, and so other workers have employed a vapour phase growth step after the undercutting. This technique is described in a paper by T L Koch et al entitled 'Low-Threshold High-Speed 1.55 µm Regrown Buried Heterostructure Lasers' in Proceedings of IEEE 9th International Semiconductor Laser Conference, Brazil 1984, pp 80–81.

Whichever technique is used these methods still employ the blind etch undercut process which suffers from the disadvantage that there is no direct control over the length of undercut. Various factors including etchants, etching time, temperature, layer thickness and the previous etching stage on the cap layer all contribute to cause fluctuations in the length of undercut and therefore in the defined width of the active region.

The present invention is directed towards providing improved control in fabricating semiconductor structures having undercut semiconductor layers in cross section.

According to a first aspect of the present invention there is provided a fabrication technique for making a semiconductor structure having at least a lower layer and an upper layer, the upper layer having at least a portion which extends above and overhangs a lateral boundary of the lower layer, comprising the steps of:

i) creating a lower layer on a substrate;
ii) making a boundary defining opening through the lower layer at least as far as the substrate;
iii) creating an upper layer which extends above the lower layer, and which has a barrier portion which extends through the boundary defining opening at least as far as the substrate;
iv) making an access opening through the upper layer which is laterally offset relative to the boundary defining opening, and exposing the lower layer at that access opening; and
v) selectively removing the lower layer with respect to the upper layer at least partially from the region between the access opening and the barrier portion of the upper layer such that the upper layer overhangs a lateral boundary of the lower layer, the barrier portion providing a lateral limit to selective removal of the lower layer.

(Although words such as "lower" and "upper" are used in the present specification it is for the convenience of description only and should not be taken to indicate any necessary specific orientation unless the context implies otherwise.)

By using a fabrication technique as described above, it is possible to pre determine at least a limiting position for a boundary in a layer, even in blind etching that layer so as to have the boundary overhung by another layer. Although it may not be necessary to remove all the material of the lower layer which lies between the access opening and the barrier portion of the upper layer, the barrier portion can provide a lateral limit to that removal by protecting the material of the lower layer which lies on the far side of the barrier portion with respect to the access opening, from for instance a selective etchant.

The making of an access opening may not necessarily in practice comprise a separate step in the fabrication technique. The opening may for instance be provided by a boundary in the upper layer which is determined during creation of the upper layer, perhaps by photolithographic masking.

The layers may conveniently be produced by known epitaxial growth techniques such as metal organic vapour phase epitaxy. Each layer and the substrate may in practice comprise sublayers of the same or different materials.

Particularly where the semiconductor structure is a constricted mesa laser structure, the fabrication technique also offers an advantage in the control it can provide over the dimensions of the barrier portion of the upper layer. If the lower layer is an active material layer and the upper layer is the cap layer of such a laser structure, then the barrier portion of the upper layer will constitute the semiconductor material at the sides of the active region in a fabricated device. Because the dimensions of the barrier portion are determined by step ii) above, making the boundary defining opening through the lower layer, those dimensions can be selected and applied by means of a relatively simple, exposed etching process.

(It will be appreciated that during step v) above, selective removal of the lower layer with respect to the upper layer, a little material of the upper layer may also be removed, and possibly the dimensions of the barrier portion very slightly reduced. This is because selective etchants are not generally perfectly selective but tend to etch one material at a rate many times faster than the rate at which another material is etched. The effect is not significant however.)

The semiconductor structure may well incorporate semiconductor layers in addition to the lower and upper layers, such as a buffer layer lying between them. This need not affect the creation and use of a barrier portion as described above. It will be understood however that the making of an access opening through the upper layer may not then of itself expose the lower layer at the opening, the access opening having first to be made also in any intervening layer or layers. Such an additional layer may or may not be removed at the same time as the lower layer. For instance, if the additional layer is of the same material as the lower layer except in containing different dopant material, it may well be removed by the same selective etchant as the lower layer.

Where the semiconductor structure is a waisted mesa stripe laser structure, the fabrication technique can effectively be applied twice, to create the stripe active region overhung on both sides by a mesa cap layer. The fabrication technique may then comprise the steps of:
  i) creating a wafer having a layer of active material but no cap material;
  ii) etching a pair of neighbouring, parallel channels through the layer of active material which are separated by the width of the active region required in the finished laser structure;
  iii) depositing a continuous layer of cap material to cover and fill both channels;
  iv) etching a mesa in the layer of cap material, which mesa straddles the channels and overhangs on both sides the stripe of active material which lies between the channels; and
  v) selectively removing the active material which lies between each edge of the mesa and the nearest channel.

Preferably, the channels should be as narrow as possible, for instance not more than 1 micron wide, so as to minimise shunt currents and stray capacitance in a finished laser structure.

According to a second aspect of the present invention, there is provided a fabrication technique according to the first aspect as described above, which comprises making two neighbouring boundary defining openings through the lower layer to the substrate, the upper layer extending over both of said openings and having two barrier portions which each extend through a respective boundary defining opening at least as far as the substrate, making two access openings lying each laterally offset to a respective side of the two boundary defining openings, and selectively removing the lower layer between each of the two access openings and the nearest respective boundary defining opening so as to leave only the material of the lower layer between the two boundary defining openings.

Using fabrication techniques according to the first aspect of the present invention, a semiconductor device structure can be created which comprises a substrate supporting a portion of a first material, which portion has a boundary set back from the edge of the substrate, and an overlying layer of a second material, the overlying layer extending beyond the boundary of the portion of a first material and being undercut substantially up to said boundary, said boundary being concealed by a downwardly extending barrier portion of the overlying layer. The barrier portion is notably an integral part of overlying layer, being created in the same operation.

It may be preferably in a finished device structure that a layer off dielectric material such as silica is used to cover all or part of the structure. This dielectric material may fill in the undercut below the overlying layer up to the boundary of the portion of a first material. However, such a finished device structure is still considered to fall within the above description of a semiconductor device structure having an undercut overlying layer when regarded in terms of the semiconductor layers only.

The word "active" where used in the present specification to describe a material, region or layer, is used in the sense that the material, region or the material of such a layer is capable of lasing action.

Within the context of this specification 'laser structure' includes structures that may be used other than under lasing conditions, eg as a modulator.

The invention will now be described by way of example with reference to the accompanying drawings in which.

The undercutting technique of the invention is described with reference to a buried heterostructure laser. However, it will be realised that a similar technique may be utilised for other structures where a non surface layer requires etching with defined accuracy.

Figure 1:
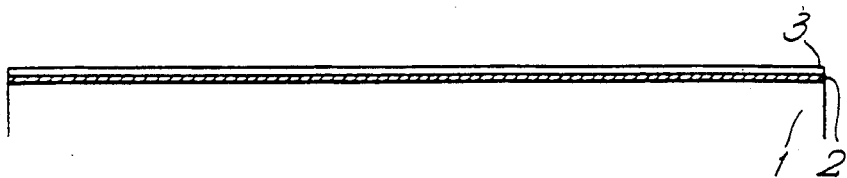
FIG. 1 is a schematic cross section through a slice or wafer showing the structure of the layers prior to further fabrication.

In FIG. 1 the starting layers are shown which consist of a substrate 1, active layer 2, and buffer stop layer 3. For optical communication purposes the final laser will require an operating wavelength close to one of the absorption minima of silica fibres, that is with a wavelength in the ranges of 1.25 to 1.35 microns or 1.50 to 1.55 microns. Therefore the structure will preferably comprise an In Ga As P active layer and an InP substrate and it is within this context, with an n-type substrate that the following procedures are described. A 'reverse' structure with p-type substrate and all the other layers of opposite type may be fabricated in an analogous way.

Figure 2:
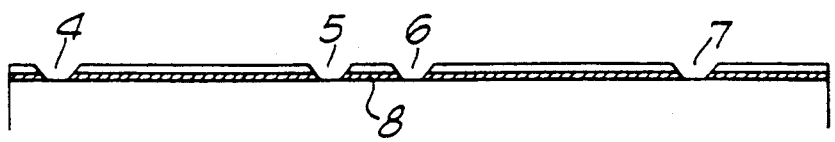
FIGS. 2 to 6 are schematic cross sections showing in sequence various stages in the fabrication process.

The substrate 1 is a slice of 001 orientation indium phosphide doped n-type to a level in the approximate range 1 to 10, $\times 10^{18}$ cm$^{-3}$. The last 0.1 micron or so of the substrate preferably consists of a separately grown buffer layer also of n-type indium phosphide doped to a level of about $1\times 10^{18}$ cm$^{-3}$. The active layer 2 is typically about 0.1 microns thick (the more general range being of the order of 0.05 to 0.4 microns depending upon application) and consists of In$_{0.6}$Ga$_{0.4}$As$_{0.88}$P$_{0.12}$ for 1.5 micron wavelength operation or In$_{0.7}$Ga$_{0.3}$As$_{0.64}$P$_{0.36}$ for 1.3 micron wavelength operation. This active layer is nominally undoped but in practical terms is likely to have a starting n-type level of around $1\times 10^{17}$ cm$^{-3}$ and after fabrication is completed diffusion from the other layers is likely to turn the active layer p type to a level of about $5\times 10^{17}$ cm$^{-3}$. After the active layer is grown the buffer stop layer 3 is deposited which is composed of p-type indium phosphide doped to a level of about $1\times 10^{18}$ cm$^{-3}$. This structure is then subjected to photolithographic masking to define four windows through which the buffer layer 3 and active layer 2 are removed as shown in FIG. 2 to form channels 4, 5, 6 and 7. A two stage selective etching process is used, for example using 30°/o hydrochloric acid or a mixture of 4 parts hydrochloric and 1 part (90°/o) orthophosphoric acid to remove the indium phosphide buffer and 16°/o iodic acid to remove the In Ga As P. This ensures that the second etch stops (or effectively so as the rate of etching is a factor of 10 or so slower on indium phosphide) at the substrate surface. The channels 4, 5, 6 and 7 are made as narrow as possible, for example about one micron in width. Channels 5 and 6 are spaced by 1 to 2 microns depending on the desired final width of the active layer which becomes defined in a mesa 8 between channels 5 and 6. It will be realised that although the Figures show sloping sides to the channels the layers 2 and 3 have only a total depth of about 0.2 microns and so the window defined by the photolithography will very closely match the base of the channel. More vertical sides may be achieved, and therefore greater accuracy, by using a dielectric (silica) layer as the mask but for this stage this is usually not necessary. The spacing between channels 4 and 5 and between channels 6 and 7 is not critical.

Figure 3:
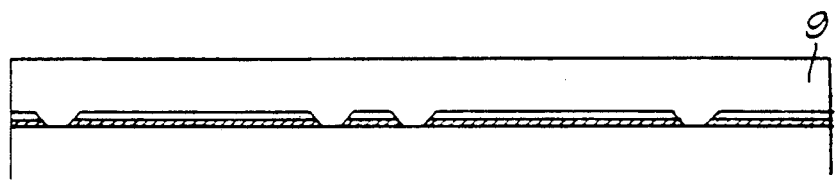
Figure 4:
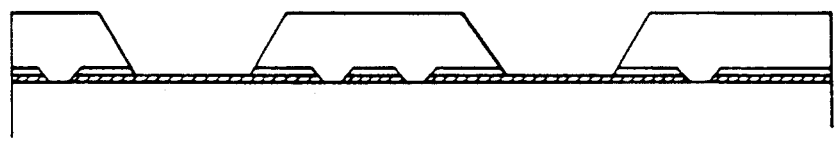
Figure 5:
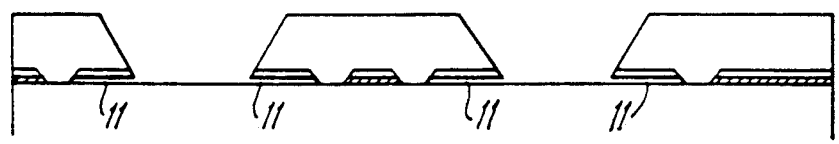

After the channels have been etched a layer 9 of p-type indium phosphide is grown over the resulting structure, as shown in FIG. 3. This layer is typically 1 to 1.5 microns thick doped to a level of $1\times 10^{18}$ cm$^{-3}$. A second masking stage is then performed, which may again be by photolithography only, or a silica mask, itself defined by a photolithography stage, may be used. An etchant selective to indium phosphide (eg 30°/o HCl) is then used to remove the layer 9 and the buffer layer 3 through the windows of the mask as shown in FIG. 4. Then an etchant selective to In Ga As P (eg nitric acid) is used to remove the active layer as shown in FIG. 5. Nitric acid is preferred for this stage as it is not particularly selective to crystallographic orientation. It will be realised looking at FIG. 5 that the indium phosphide layer 9 is substantially undercut to form cavities 11 by this latter active layer etch, but the extent of the undercutting is defined by the indium phosphide grown in the channels 4, 5, 6 and 7 formed at the first etching stage (FIG. 2). Thus once the etchant reaches the indium phosphide filled channels the undercutting stops.

Figure 6:
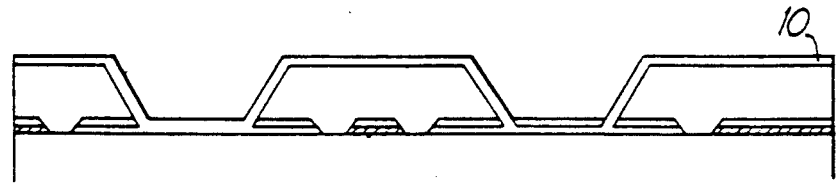

After the undercutting Stage a layer 10 of silica (or other dielectric) is grown over the surface to a depth of about 0.3 microns as shown in FIG. 6. This silica layer is grown by a vapour phase reaction between silane and oxygen and deposits over the entire surface. The undercut cavities 11 may become filled with silica or some void may remain with only the openings blocked. A window is then opened in the silica in the region above the active layer mesa 8 and a metallisation layer 12 deposited. The device is then completed by metallising the substrate and mounting substrate uppermost on a heat sink. The metallisations comprise a thin layer of titanium followed by a thin layer of gold.

Figure 7:
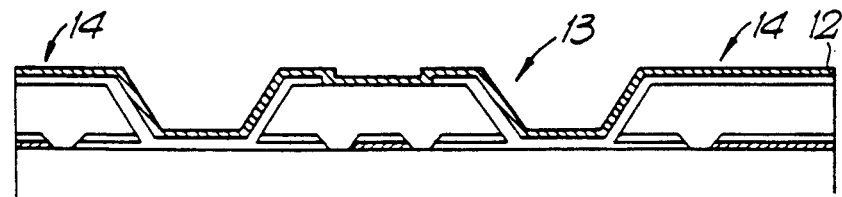
FIG. 7 is a schematic cross section through a completed laser structure fabricated according to the invention.

The final laser structure shown in FIG. 7 has very low parasitic capacitance and leakage currents due to the comparatively small areas that can give rise to these properties. Both parasitic capacitance and leakage currents depend upon the area of contact between the p-type indium phosphide cap layer 9 and the n-type indium phosphide substrate. In the structure formed in accordance with the invention this is limited to the channel areas 5 and 6, the rest of the structure then being isolated by dielectric.

It will be realised that the device is defined by the active layer mesa 8, the filled channels 5 and 6 and the other parts in the central large mesa 13 of FIG. 7. The satellite mesas indicated as 14 are not part of the device as such but aid in providing structural stability and reducing leakage current in the event of pinholes in the dielectric layer 10. Structurally, the laser is mounted substrate uppermost on a heat sink and there is greater stability in mounting the combined surfaces of the mesas 13 and 14 than in mounting the central mesa 13 alone. In the event of pinholes in the dielectric these create much greater leakage currents if they occur on top of the substrate rather than on top of the cap layer 9.

The self stopping undercut technique may be applied to other devices where a buried layer requires etching, examples of devices in which the technique is applicable include electro-optic devices, electro absorption modulators and heterojunction transistors. Other materials than those described may be subjected to selective etching. It is also possible for at least some of the etching to be other than chemical etching; sputtering or ion beam milling may be used which would not be selective but may be used especially for removing the cap layer for example, or reactive ion etching may be used, in this latter case selective etching being achieved by the diffusion contact rather than momentum collision process.

I claim:

1. A fabrication technique for a semiconductor device, the device comprising a structure having at least a lower epitaxial semiconductor layer and an upper epitaxial semiconductor layer, the upper layer having at least a portion which extends above and overhangs a lateral boundary of the lower layer, comprising the steps of:
   (i) creating a lower epitaxial semiconductor layer of a first material on a substrate;
   (ii) making a boundary defining opening through the lower layer at least as far as the substrate;
   (iii) creating an upper layer of a second material which extends above the lower layer and which has a barrier portion which extends through the boundary defining opening at least as far as the substrate;
   (iv) making an access opening through the upper layer which is laterally offset relative to the boundary defining opening, and exposing the lower layer at that access opening; and
   (v) selectively removing the lower layer with respect to the upper layer at least partially from the region between the access opening and the barrier portion of the upper layer such that the upper layer overhangs a lateral boundary of the lower layer, the barrier portion providing a lateral limit to selective removal of the lower layer.

2. A technique according to claim 1 wherein the lower layer is entirely removed from the region between the access opening and the barrier portion, said lateral boundary of the lower layer being on the far side of the barrier portion with respect to the access opening.

3. A technique according to either one of claims 1 or 2 wherein the access opening defines a lateral boundary in the upper layer.

4. A technique according to any one of the preceding claims 1 or 2 wherein the semiconductor structure includes at least one additional layer which lies between the lower and upper layers.

5. A technique according to any one of the preceding claims 1 or 2 wherein the access opening is provided by the side of a mesa which overlies the lateral boundary of the lower layer and the barrier portion of the upper layer.

6. A fabrication technique according to any one of the preceding claims 1 or 2 which comprises making two neighbouring boundary defining openings through the lower layer to the substrate, the upper layer extending over both of said openings and having two barrier portions which each extend through a respective boundary defining opening at least as far as the substrate, making two access openings lying each laterally offset to a respective side of the two boundary defining openings, and selectively removing the lower layer so as to leave only the material of the lower layer lying between the two boundary defining openings.

7. A technique according to claim 6 wherein the two boundary defining openings define a stripe of material of the lower layer which is not more than 5 microns wide.

8. A fabrication technique for a multi layer semiconductor structure comprising making at least one opening in an epitaxial semiconductor first layer of semiconductor material, providing a second layer of different semiconductor material over at least a part of the first layer and into the opening, making an opening in the second layer to expose said first layer beneath and selectively removing the first layer in the direction of the boundary of the second layer in the opening of the first layer.

9. A technique according to any one of the preceding claims 1, 2 or 8 in which the openings are made by etching.

10. A technique according to claim 8 in which the opening in the second layer is laterally displaced from the opening in the first layer so that the selective removal of the first layer undercuts the second layer.

11. A technique according to any preceding claim 1, 2 or 8 in which a dielectric layer is deposited over the opening in the second layer and over at least part of the surface exposed by the selective removal of the first layer.

12. A fabrication technique according to any one of claims 8 or 10 in which the first layer is removed right up to the boundary of the second layer in the opening of the first layer.

13. A fabrication technique, for use in making a semiconductor stripe laser structure of the type having a stripe of active material, comprising the steps of:
(i) creating a first epitaxial semiconductor layer on a substrate;
(ii) making two neighbouring channels through the first layer to the substrate;
(iii) creating a second semiconductor material layer which extends over, and fills, both the neighbouring channels; and
(iv) selectively removing the semiconductor material of the first layer with respect to the semiconductor material of the second layer so as to leave only the semiconductor material of the first layer which lies between the neighbouring channels and which will provide the strips of active material in said stripe laser structure.

14. A technique according to claim 13 wherein the distance separating the neighbouring channels is 5 microns or less.

15. A method for fabricating a semiconductor structure of the type comprising a substrate, a lower semiconductor layer disposed on said substrate, and an upper semiconductor layer disposed on said lower semiconductor layer, the upper semiconductor layer having at least a portion extending above and overhanging a lateral boundary of the lower semiconductor layer, said method including the following steps:
(i) before forming said upper semiconductor layer on said lower semiconductor layer, forming a boundary defining opening through the formed lower semiconductor layer, including the step of exposing said substrate through said opening;
(ii) forming an upper semiconductor layer barrier portion extending through the boundary defining opening made by said making step (i) and extending at least as far as the substrate;
(iii) making an access opening laterally offset relative to the boundary defining opening through the upper semiconductor layer;
(iv) exposing the lower semiconductor layer at that access opening; and
(v) subsequent to said exposing step (iv), forming an upper semiconductor layer overhanging portion which overhangs a lateral boundary of the lower semiconductor layer, including the following steps:
selectively removing the lower semiconductor layer with respect to the upper semiconductor layer at least partially from the region between the access opening and the barrier portion of the upper semiconductor layer, and
laterally limiting removal of the lower semiconductor layer with the barrier portion.

16. A process for more accurately fabricating a multiple layer semiconductor structure in which one semiconductor layer substantially overhangs another, said process including the following steps:
(a) forming a first opening through a first semiconductor layer of a first material at a desired boundary position;
(b) subsequent to said forming step (a), forming, on said first semiconductor layer, a second semiconductor layer of a second material different from first material, including the step of forming a barrier portion of said second semiconductor layer within said first opening;
(c) forming a further opening through said second semiconductor layer and thereby exposing said first semiconductor layer through said further opening;
(d) selectively removing the first semiconductor layer via said further opening; and
(e) limiting removal of said first semiconductor layer by said removing step at said boundary position with said barrier portion within said first opening.

* * * * *

UNITED STATES PATENT AND TRADEMARK OFFICE
CERTIFICATE OF CORRECTION

PATENT NO. : 5,026,662

DATED : 25 June 1991

INVENTOR(S) : Leslie D. Westbrook

It is certified that error appears in the above-identified patent and that said Letters Patent is hereby corrected as shown below: ON THE DRAWING SHEET In Figure 6, 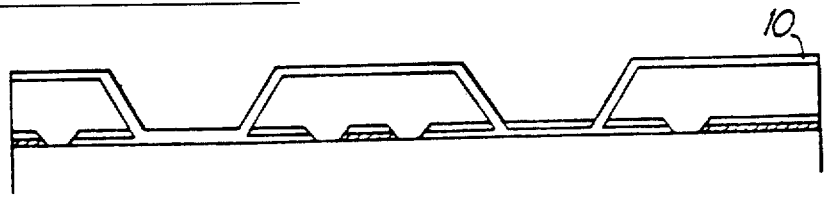

at the bottom of the right-most trough, eliminate extraneous lines so as to make the layer 10 properly shown in a continuous fashion as it is already shown at a corresponding location in Figure 7 and at the left-hand trough in Figures 6 and 7 and as indicated below:

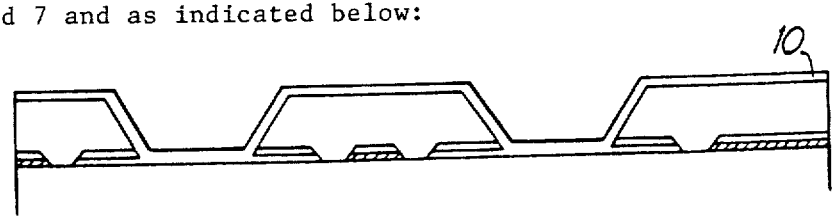

Column 5, lines 22, 23, 25 and 50 change "°/o" to --%--.

Column 8, line 11, change "strips" to --stripe--.

Signed and Sealed this

First Day of December, 1992

*Attest:*

DOUGLAS B. COMER

*Attesting Officer*      *Acting Commissioner of Patents and Trademarks*